United States Patent
Freitag et al.

(10) Patent No.: US 11,283,006 B1
(45) Date of Patent: Mar. 22, 2022

(54) METHODS AND APPARATUS OF HIGH MOMENT FREE LAYERS FOR MAGNETIC TUNNEL JUNCTIONS

(71) Applicant: Western Digital Technologies, Inc., San Jose, CA (US)

(72) Inventors: James Mac Freitag, Sunnyvale, CA (US); Zheng Gao, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 73 days.

(21) Appl. No.: 16/867,380

(22) Filed: May 5, 2020

(51) Int. Cl.
H01L 43/02 (2006.01)
H01L 27/22 (2006.01)
G11B 5/39 (2006.01)
H01F 10/32 (2006.01)
H01L 43/10 (2006.01)

(52) U.S. Cl.
CPC ............ H01L 43/02 (2013.01); G11B 5/3909 (2013.01); H01F 10/3272 (2013.01); H01L 27/222 (2013.01); H01L 43/10 (2013.01)

(58) Field of Classification Search
CPC ........ H01L 43/02; H01L 43/10; H01L 27/222
See application file for complete search history.

(56) References Cited

U.S. PATENT DOCUMENTS

| | | | |
|---|---|---|---|
| 7,351,483 B2 | 4/2008 | Parkin | |
| 8,900,884 B2 | 12/2014 | Kula et al. | |
| 9,070,381 B1 | 6/2015 | Yang et al. | |
| 9,099,124 B1* | 8/2015 | Freitag | G01R 33/093 |
| 9,577,184 B2 | 2/2017 | Zhao et al. | |
| 2005/0110004 A1 | 5/2005 | Parkin et al. | |
| 2009/0155629 A1 | 6/2009 | Gill | |
| 2012/0127603 A1* | 5/2012 | Gao | G11B 5/3909 |
| | | | 360/75 |

FOREIGN PATENT DOCUMENTS

JP 2010166051 A 7/2010

OTHER PUBLICATIONS

Ikeda, S. et al., "Tunnel magnetoresistance in MgO-barrier magnetic tunnel junctions with bcc-CoFe(B) and fcc-CoFe free layers", American Institute of Physics, vol. 99, Issue 8, May 3, 2006 <https://aip.scitation.org/doi/abs/10.1063/1.2176588#>.
Lee, Seung-Eun et al., "Highly Enhanced TMR Ratio and Δ for Double MgO-based p-MTJ Spin-Valves with Top Co2Fe6B2 Free Layer by Nanoscale-thick Iron Diffusion-barrier" Scientific Reports, vol. 7,1 11907, Sep. 19, 2017 <https://www.ncbi.nlm.nih.gov/pmc/articles/PMC5605541/>.

* cited by examiner

*Primary Examiner* — Marc Anthony Armand
(74) *Attorney, Agent, or Firm* — Patterson & Sheridan, LLP; Steven H. Versteeg

(57) ABSTRACT

The present disclosure generally relates to magnetoresistive device apparatus and methods. The magnetoresistive device includes a read head. The read head is a tunneling magnetoresistive reader that includes a multilayer free layer structure. The multilayer structure includes one or more layers of Co or FCC FeCo sandwiched between a BCC CoFe50 nanolayer and an amorphous CoFeB layer. The one or more layers of Co or FCC FeCo create nanocrystalline disorder that allows the thickness of the amorphous CoFeB layer to be reduced while retaining or even improving TMR and reducing the interlayer coupling field.

29 Claims, 8 Drawing Sheets

METHODS AND APPARATUS OF HIGH MOMENT FREE LAYERS FOR MAGNETIC TUNNEL JUNCTIONS

BACKGROUND OF THE DISCLOSURE

Field of the Disclosure

The present disclosure generally relates to magnetoresistive device apparatus and methods. In one example, the magnetoresistive device is a part of a read sensor of a read head of a data storage device, such as a magnetic media drive.

Description of the Related Art

Efforts can be made to utilize sensors in relation to hard disk drives that are thinner, have high recording densities, and have lower resistance-area product (RA) in order to attempt to achieve higher volumes of data that can be stored and processed by computers. However, using such sensors can lower tunnel magnetoresistance (TMR), increase interlayer coupling, lower magnetic moments, and decrease signal-to-noise ratio (SNR). Such issues can degrade sensors and hinder sensor performance and resolution.

Therefore, there is a need for sensors that facilitate higher TMR with reduced interlayer coupling (Hint), and sensor asymmetry.

SUMMARY OF THE DISCLOSURE

The present disclosure generally relates to magnetoresistive device apparatus and methods. In one example, the magnetoresistive device is a part of a read sensor of a read head of a data storage device, such as a magnetic media drive. The magnetoresistive device includes a read head. The read head is a tunneling magnetoresistive reader that includes a multilayer free layer structure. The multilayer structure includes one or more layers of Co or FCC FeCo sandwiched between a BCC CoFe50 nanolayer and an amorphous CoFeB layer. The one or more layers of Co or FCC FeCo create nanocrystalline disorder that allows the thickness of the amorphous CoFeB layer to be reduced while retaining or even improving TMR.

In one implementation, a magnetoresistive device includes a barrier layer and a free layer above the barrier layer. The free layer includes a ferromagnetic nanolayer on the barrier layer, and a boron layer above the ferromagnetic nanolayer. The boron layer includes one or more of CoFeB or CoB. The free layer includes one or more layers between the ferromagnetic nanolayer and the boron layer. The one or more layers includes one or more of Co or CoFe. The magnetoresistive device also includes a non-ferromagnetic capping layer above the free layer.

In one implementation, a magnetoresistive device includes a seed layer, a barrier layer above the seed layer, and a free layer above the barrier layer. The free layer includes a ferromagnetic nanolayer on the barrier layer. The ferromagnetic nanolayer includes a crystalline structure that is BCC. The free layer also includes an amorphous layer above the ferromagnetic nanolayer, and one or more layers between the ferromagnetic nanolayer and the amorphous layer. The one or more layers include a crystalline structure that is FCC. The magnetoresistive device also includes a non-ferromagnetic capping layer above the free layer.

In one implementation, a magnetoresistive device includes a seed layer, a barrier layer above the seed layer, and a free layer above the barrier layer. The free layer includes a ferromagnetic nanolayer on the barrier layer, and a boron layer above the ferromagnetic nanolayer. The boron layer includes one or more of CoFeB or CoB, and the boron layer includes a thickness of 15 Angstroms or less. The free layer also includes one or more layers between the ferromagnetic nanolayer and the boron layer. The one or more layers each include a thickness of 10 Angstroms or less. The magnetoresistive device also includes a non-ferromagnetic capping layer above the free layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to magnetoresistive device apparatus and methods. In one example, the magnetoresistive device is a part of a read sensor of a read head of a data storage device, such as a magnetic media drive. The magnetoresistive device includes a read head. The read head is a tunneling magnetoresistive reader that includes a multilayer free layer structure. The multilayer structure includes one or more layers of Co or FCC FeCo sandwiched between a BCC CoFe50 nanolayer and an amorphous CoFeB layer. The one or more layers of Co or FCC FeCo create nanocrystalline disorder that allows the thickness of the amorphous CoFeB layer to be reduced while retaining or even improving TMR.

Figure 1:
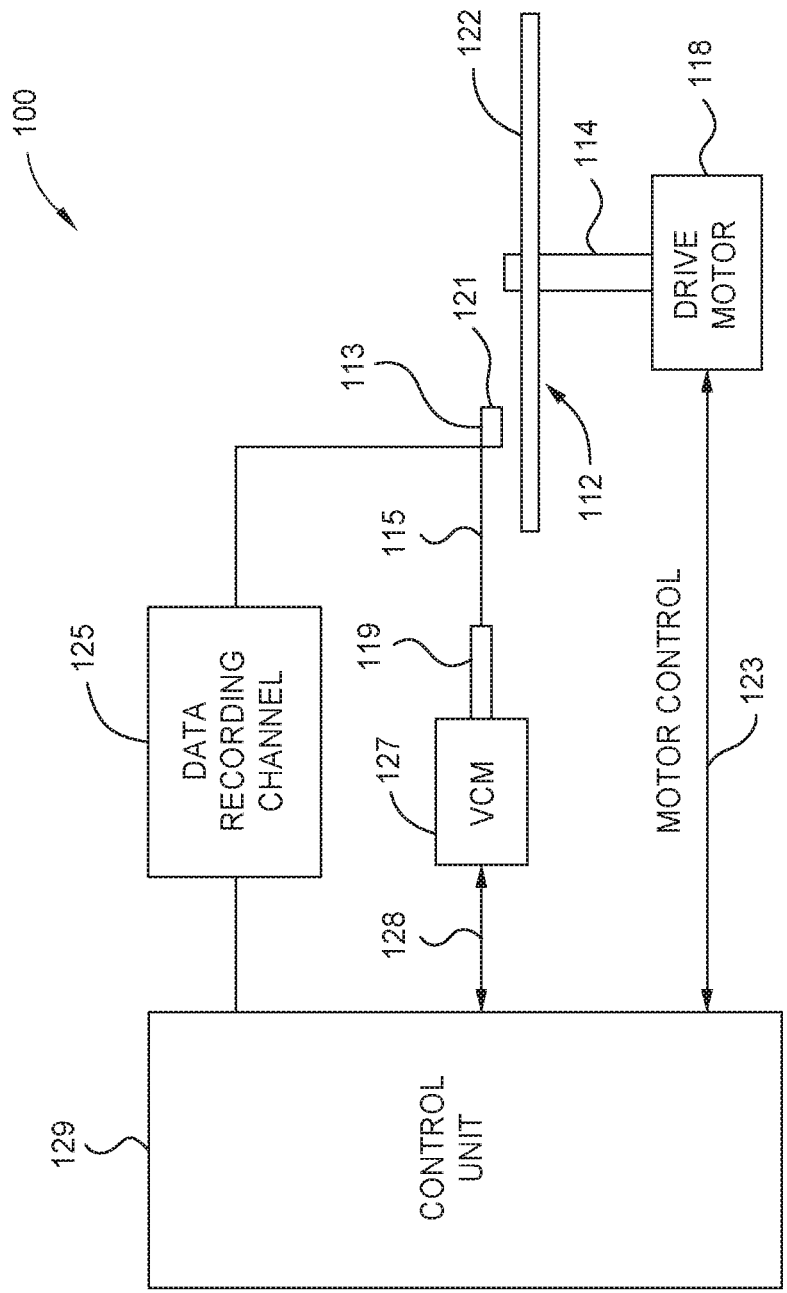
FIG. 1 is a schematic illustration of a magnetic media drive including a magnetic read head, according to one implementation.

FIG. 1 is a schematic illustration of a magnetic media drive 100 including a magnetic read head, according to one implementation. The magnetic media drive 100 may be a single drive/device or include multiple drives/devices. The magnetic media drive 100 is a disk drive, such as a hard disk drive. The magnetic media drive 100 includes a magnetic recording medium, such as one or more magnetic disks 112 supported on a spindle 114 and rotated by a drive motor 118. The one or more magnetic disks 112 are rotatable. For ease of illustration, a single disk drive is shown in the implementation illustrated. The magnetic recording on each magnetic disk 112 is in the form of any suitable patterns of data tracks, such as annular patterns of concentric data tracks on the magnetic disk 112.

It is to be understood that the magnetic recording head discussed herein is applicable to a data storage device such as a hard disk drive (HDD) as well as a tape drive such as a tape embedded drive (TED) or an insertable tape media drive. An example TED is described in co-pending patent application titled "Tape Embedded Drive," U.S. application Ser. No. 16/365,034, filed Mar. 31, 2019, assigned to the same assignee of this application, which is herein incorporated by reference. As such, any reference in the detailed description to a HDD or tape drive is merely for exemplification purposes and is not intended to limit the disclosure unless explicitly claimed. Furthermore, reference to or claims directed to magnetic recording devices are intended to include both HDD and tape drive unless HDD or tape drive devices are explicitly claimed.

It is also to be understood that aspects disclosed herein, such as the magnetoresistive devices, may be used in magnetic sensor applications outside of HDD's and tape media drives such as TED's, such as spintronic devices other than HDD's and tape media drives. As an example, aspects disclosed herein may be used in magnetic elements in magnetoresistive random-access memory (MRAM) devices (e.g., magnetic tunnel junctions as part of memory elements), magnetic sensors or other spintronic devices.

At least one slider 113 is positioned near the magnetic disk 112. Each slider 113 supports a head assembly 121 including one or more read/write heads, such as a write head and such as a read head that includes a TMR device. As the magnetic disk 112 rotates, the slider 113 moves radially inward and outward over a disk surface 122 of the magnetic disk 112 so that the head assembly 121 may access different tracks of the magnetic disk 112 where desired data are written or read. Each slider 113 is attached to an actuator arm 119 by way of a suspension 115. The suspension 115 provides a slight spring force that biases the slider 113 toward the disk surface 122. Each actuator arm 119 is attached to an actuator 127. The actuator 127 as shown in FIG. 1 may be a voice coil motor (VCM). The VCM includes a coil movable within a fixed magnetic field, the direction and speed of the coil movements being controlled by the motor current signals supplied by a control unit 129.

During operation of the magnetic media drive 100, the rotation of the magnetic disk 112 generates an air or gas bearing between the slider 113 and the disk surface 122 which exerts an upward force or lift on the slider 113. The air or gas bearing facilitates counter-balancing the slight spring force of the suspension 115 and supports the slider 113 off and slightly above the disk surface 122 by a small, substantially constant spacing during normal operation.

The various components of the magnetic media drive 100 are controlled in operation by control signals generated by the control unit 129, such as access control signals and internal clock signals. The control unit 129 includes logic control circuits, storage means (such as a memory) and a microprocessor (such as a CPU). The control unit 129 generates control signals to control various system operations such as drive motor control signals on a line 123 and head position, and seek control signals on a line 128. The control signals on line 128 provide the desired current profiles to optimally move and position slider 113 to the desired data track on the magnetic disk 112. Write and read signals are communicated to and from the head assembly 121 by way of a recording channel 125. Embodiments of a magnetic media drive of FIG. 1 may further include a plurality of media, or disks, a plurality of actuators, and/or a plurality number of sliders.

Figure 2:
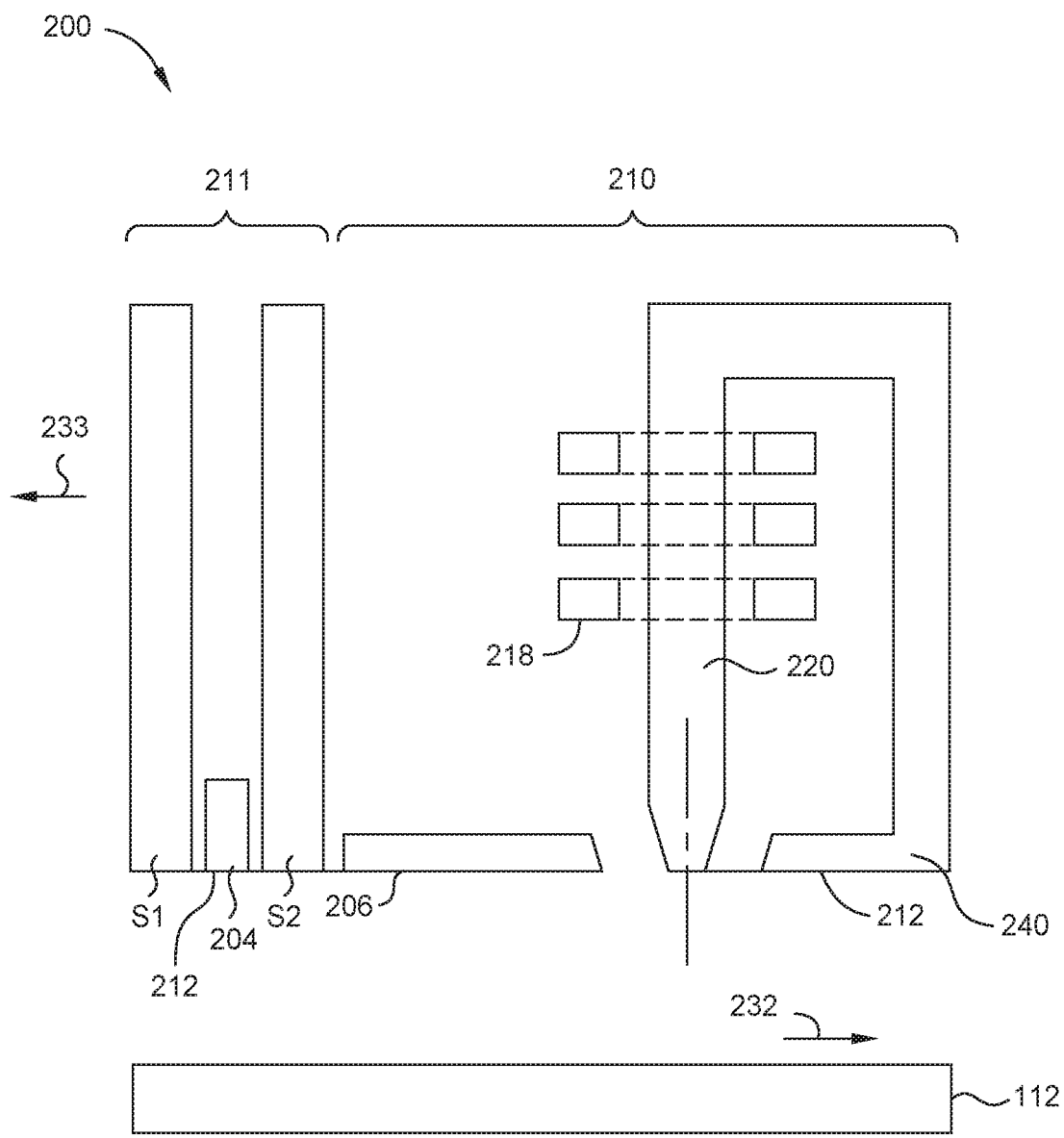
FIG. 2 is a schematic illustration of a cross sectional side view of a head assembly facing a magnetic storage medium, such as the magnetic disk illustrated in FIG. 1, according to one implementation.

FIG. 2 is a schematic illustration of a cross sectional side view of a head assembly 200 facing a magnetic storage medium, such as the magnetic disk 112 illustrated in FIG. 1, according to one implementation. The head assembly 200 may correspond to the head assembly 121 described in FIG. 1. The head assembly 200 includes a media facing surface (MFS) 212, such as an air bearing surface (ABS), facing the magnetic disk 112. As shown in FIG. 2, the magnetic disk 112 relatively moves in the direction indicated by the arrow 232 and the head assembly 200 relatively moves in the direction indicated by the arrow 233.

The head assembly 200 includes a magnetic read head 211 that includes a magnetoresistive device. The magnetic read head 211 includes a sensing element 204 (e.g., a sensor) disposed between two shields S1 and S2. The sensing element 204 and the shields S1 and S2 have the MFS 212 facing the magnetic disk 112. The sensing element 204 is a TMR device sensing the magnetic fields of the recorded bits, such as perpendicular recorded bits or longitudinal recorded bits, in the magnetic disk 112 by a TMR effect. In one embodiment, which can be combined with other embodiments, a spacing between shields S1 and S2 is about 17 nm or less.

The head assembly 200 may optionally include a write head 210. The write head 210 includes a main pole 220, a leading shield 206, and a trailing shield (TS) 240. The main pole 220 includes a magnetic material and serves as a main electrode. Each of the main pole 220, the leading shield 206, and the trailing shield (TS) 240 has a front portion at the MFS 212. The write head 210 includes a coil 218 around the main pole 220 that excites the main pole 220 producing a writing magnetic field for affecting a magnetic recording medium of the magnetic disk 112. The coil 218 may be a helical structure or one or more sets of pancake structures. The TS 240 includes a magnetic material, serving as a return pole for the main pole 220. The leading shield 206 may provide electromagnetic shielding and is separated from the main pole 220 by a leading gap 254.

Figure 3A:
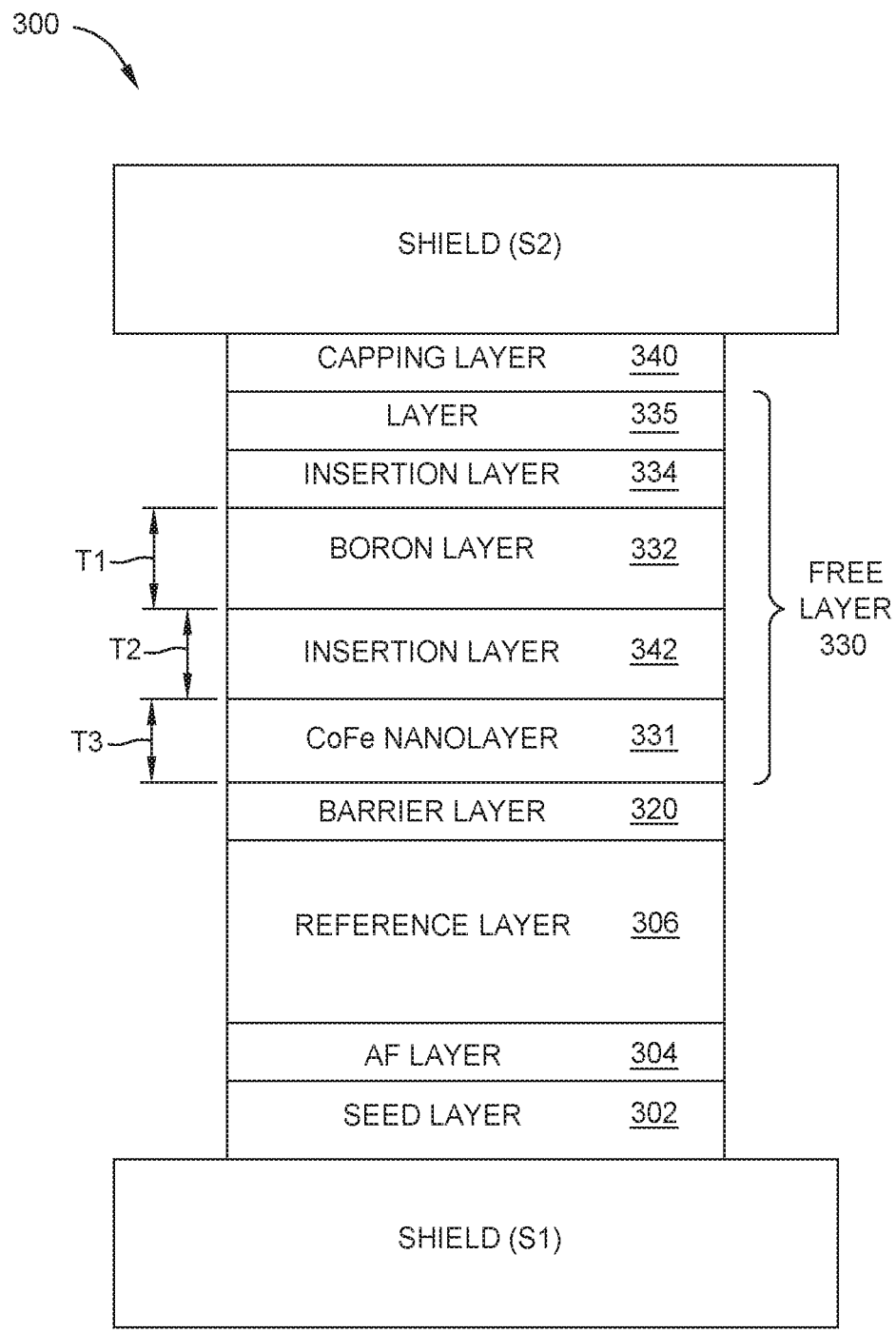
FIG. 3A is a schematic illustration of a media facing surface (MFS) of a magnetoresistive device between the shields of a magnetic read head (such as the magnetic read head illustrated in FIG. 2 or other magnetic read heads) that includes a one or more layers in a free layer, according to one implementation.

FIG. 3A is a schematic illustration of a media facing surface (MFS) of a magnetoresistive device 300 between the shields S1 and S2 of a magnetic read head (such as the magnetic read head 211 illustrated in FIG. 2 or other magnetic read heads) that includes a one or more layers 342 in a free layer 330, according to one implementation. The magnetoresistive device 300 includes a reference layer 306, a barrier layer 320 over the reference layer 306, and a free layer 330 over the barrier layer 320. The reference layer 306 can be an antiferromagnetic coupled or pinned reference structure. In one embodiment, which can be combined with other embodiments, the reference layer 306 is ferromagnetic and can include a ferromagnetic pinned layer or a pinner layer anti-ferromagnetically coupled to the ferromagnetic reference layer 306 through a non-magnetic spacer that includes for example ruthenium (Ru). The magnetoresistive device 300 may include an insertion layer and/or an amorphous layer disposed above, below and/or as part of the free layer 330.

In one embodiment, which can be combined with other embodiments, the magnetoresistive device 300 can be fabricated by forming a seed layer 302, over a lower shield S1. An antiferromagnetic exchange pinning layer (AFM) 304 is formed over the seed layer 302. The reference layer 306 is formed over the AFM pinning layer 304. The barrier layer 320 is formed over the reference layer 306. The free layer 330 is formed over the barrier layer 320. A non-ferromagnetic capping layer 340 is formed over the free layer 330. An upper shield S2 is formed over the non-ferromagnetic capping layer 340. The free layer 330 includes a ferromagnetic nanolayer 331 on the barrier layer 320, a boron layer 332 above the ferromagnetic nanolayer 331, and one or more layers 342 between the ferromagnetic nanolayer 331 and the boron layer 332.

The boron layer 332 is a ferromagnetic boron compound layer. The one or more layers 342 include one or more of Co or CoFe. The one or more layers 342 are one or more ferromagnetic insertion layers on the ferromagnetic nanolayer 331.

The boron layer 332 includes a thickness T1 of 15 Angstroms (Å) or less. The one or more layers 342 (one is shown) include a thickness T2 that is within a range of 5 Å and 30 Å. The ferromagnetic nanolayer 331 includes a thickness of less than 10 Å. In one embodiment, which can be combined with other embodiments, the thickness T2 of the one or more layers 342 between the ferromagnetic nanolayer 331 and the boron layer 332 is a ratio relative to the thickness T1 of the boron layer 332, and the ratio is at least 0.25

The ferromagnetic nanolayer 331 interfaces with the barrier layer 320 and facilitates a crystalline texture of the barrier layer 320, such as a barrier layer that includes MgO with (001) crystalline texture. In one embodiment, which can be combined with other embodiments, the ferromagnetic nanolayer 331 has a thickness from about 1 Å to about 10 Å.

The ferromagnetic nanolayer 331 includes CoFe with an atomic percent content of Fe from about 20% to about 80%. In certain embodiments, the ferromagnetic nanolayer 331 (e.g., CoFe ferromagnetic nanolayer 331) includes CoFe with an atomic percent content of Fe from about 50% to about 70% so that a tunneling magnetoresistive (TMR) of the magnetoresistive device is higher than a magnetoresistive device with a CoFe ferromagnetic nanolayer 331 having an atomic percent content of Fe of less than 50%. The ferromagnetic nanolayer 331 has a positive magnetostriction. A higher atomic percent content of Fe of the CoFe ferromagnetic nanolayer 331 increases the positive magnetostriction of the CoFe ferromagnetic nanolayer 331. The CoFe ferromagnetic nanolayer 331 may be referred to herein as a CoFe50 ferromagnetic nanolayer 331 to represent a Fe atomic percent content of about 50%. The CoFe50 ferromagnetic nanolayer 331 has a body centered cubic (BCC) configuration, where the atoms of the compound are arranged at the corners of the cube with another atom at the cube center. In one embodiment, which can be combined with other embodiments, the ferromagnetic layer 331 includes CoFe with Fe having an atomic percent content of about 50%, such as within a range of 45% to 55%.

The boron layer 332 is deposited on an upper layer of the one or more layers 342 (a single layer 342 is shown in FIG. 3A). The boron layer 332 includes one or more of CoFeB or CoB. In one embodiment, which can be combined with other embodiments, the boron layer 332 includes CoFeB with Fe in an atomic percent content of about 60% or less, such as from 0% to about 60%, and B in an atomic percent content from about 5% to about 50%. In one embodiment, which can be combined with other embodiments, the boron layer 332 includes B in an atomic percent content of about 5% to about 50%. The boron layer 332 may include a CoB bilayer (e.g., multiple CoB layers) that has low magnetostriction in comparison to other bilayers that include Fe or Fe alloys, such as FeB or CoFeB.

In some aspects, the low magnetostriction of the CoB bilayer improves the bias point of the sensor and reduces the noise of the magnetoresistive signal providing a higher signal-to-noise ratio (SNR) in comparison to bilayers with high magnetostriction. In some aspects, the low magnetostriction of the CoB bilayer increases the reliability of the free layer 330 due to reduced deformation and/or delamination of layers in comparison to bilayers with high magnetostriction. The CoB layer being proximate to the barrier layer 320 tends to facilitate more negative magnetostriction. In some aspects, a large thickness of a CoB layer 332 provides a negative magnetostriction to balance out the positive magnetostriction of the CoFe ferromagnetic nanolayer 331 so that the overall magnetostriction of the free layer 330 is low or zero to further increase SNR and/or to further increase reliability.

In one embodiment, which can be combined with other embodiments, the one or more layers (one is shown) 342 include CoFe having Fe in an atomic percent content of about 30% or less, such as about 0% to about 30%, or about 10%. In one example, the one or more layers 342 include CoFe having Fe in an atomic percent content of about 10%, such as within a range of 8% to 12%. The layer 342 may be referred to as a CoFe10 ferromagnetic insertion layer to represent an Fe atomic percent content of about 10%. In one example, the layer 342 has a face centered cubic (FCC) configuration, where the atoms of the compound are arranged at the corners of the cube and at the center of each cube face of the cube. The BCC structure of the (CoFe50) ferromagnetic nanolayer 331 and the FCC structure of the (CoFe10) layer 342 combine to form a disordered layer with a nano-crystalline structure.

In one example, the one or more layers 342 are grown as the FCC crystalline structure from a material having a nano-crystalline structure.

Figure 3B:
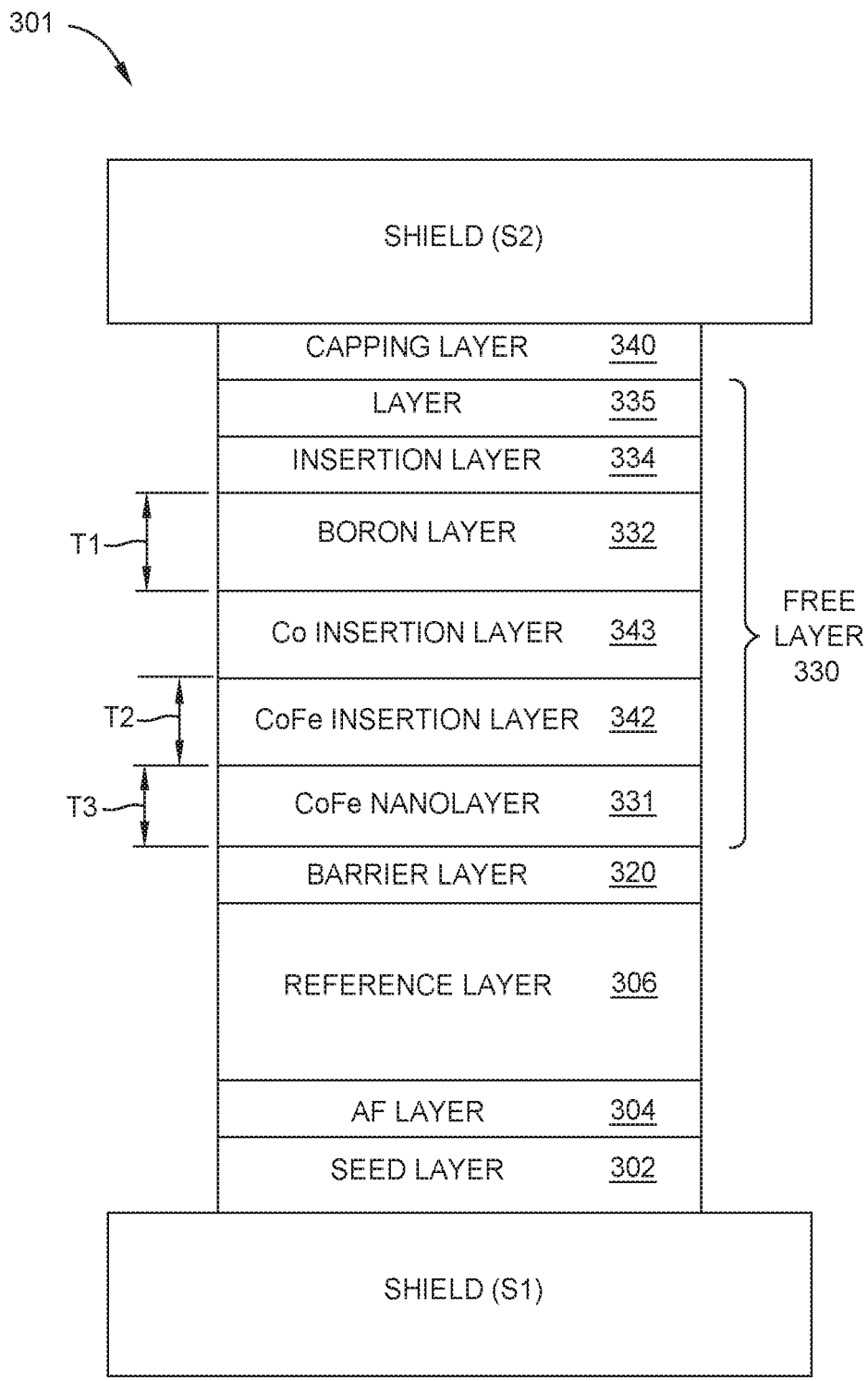
FIG. 3B is a schematic illustration of a media facing surface (MFS) of a magnetoresistive device between the shields of a magnetic read head (such as the magnetic read head illustrated in FIG. 2 or other magnetic read heads) that includes a Co insertion layer and a CoFe insertion layer in the free layer illustrated in FIG. 3A, according to one implementation.

FIG. 3B is a schematic illustration of a media facing surface (MFS) of a magnetoresistive device 301 between the shields S1 and S2 of a magnetic read head (such as the magnetic read head 211 illustrated in FIG. 2 or other magnetic read heads) that includes a Co or CoFe insertion layer 343 and a CoFe or Co insertion layer 342 in the free layer 330 illustrated in FIG. 3A, according to one implementation. A CoFe insertion layer 342 is deposited on the ferromagnetic nanolayer 331, and a Co insertion layer 343 is deposited on the CoFe insertion layer 342 in the implementation shown in FIG. 3B. The present disclosure also contemplates that the positions may be reversed such that the Co insertion layer 343 is deposited on the ferromagnetic nanolayer 331 and the CoFe insertion layer 342 is deposited on the Co insertion layer 343. The magnetoresistive device 301 shown in FIG. 3B is similar to the magnetoresistive device 300 shown in FIG. 3A, and includes one or more of the aspects, features, components, and/or properties thereof. In the implementation shown in FIG. 3B, the one or more layers between the boron layer 332 and the ferromagnetic nanolayer 331 include a first layer 342 and a second layer 343. The first layer 342 is the ferromagnetic insertion layer that forms a nano-crystalline structure as described above in relation to FIG. 3A. The first layer 342 and the second layer 343 may include Co to tune the magnetostriction of the free layer 330 to a desired range. The second ferromagnetic insertion layer 343 also has a nano-crystalline structure. The second layer 343 is deposited on the first layer 342 and below the boron layer 332. The first layer 342 is disposed between the ferromagnetic nanolayer 331 and the second layer 343.

Magnetostriction of the free layer 330 of the magnetoresistive device 300 and the magnetoresistive device 301 is due to the magnetic coupling of sub-layers of the free layer 330, the texture of the sub-layers of the free layer 330, and/or the materials of the sub-layers of the free layer 330. In one embodiment, which can be combined with other embodiments, the free layer 330 includes two or more boron layers, such as a multiple of the boron layers 332 described in FIGS. 3A-3B, each separated by one or more amorphous insertion layers, where each of the boron layers have a different thickness to control the magnetostriction of the free layer 330. For the highest TMR, amorphous CoFeB is commonly used in the free layer to achieve the proper crystallization of an MgO barrier in the sputtered magnetic tunnel junctions; likewise, amorphous CoB can be used to achieve an appropriate TMR. However, the presence of B in the free layer may cause oxygen vacancies in the MgO barrier, which may result in decreased TMR and increased interlayer coupling. Aspects disclosed herein facilitate increased TMR and decreased interlayer coupling even if B is present in the free layer.

The amorphous insertion layer 334 is deposited on the boron layer 332. The amorphous insertion layer 334 includes CoHf with an atomic percent content of Hf from about 5% to about 95%. In certain embodiments, the amorphous insertion layer 334 includes ferromagnetic CoHf with an atomic percent content of Hf from about 5% to about 30%. In other embodiments, the amorphous insertion layer 334 is selected from a group that includes CoHf, CoFeHf, CoFeTa, CoFeB, CoFeBHf, CoFeBTa, Ta, and Hf. In certain embodiments, the amorphous insertion layer 334 is formed to a thickness from about 2 Å to about 20 Å, such as from about 2 Å to about 12 Å. The amorphous insertion layer 334 can include an amorphous ferromagnetic layer and a second ferromagnetic layer used to tune properties such as magnetostriction of the free layer 330.

The insertion layer 334 may be used when the magnetoresistive device 300 includes one or more layers 335 between the capping layer 340 and the boron layer 332. The one or more layers 335 can include one or more amorphous boron layers similar to the boron layer 332, or a layer having negative magnetorestriction, such as an NiFe alloy layer for magnetorestriction control. The present disclosure contemplates that one or more layers, such as the insertion layer 334 and the one or more layers 335, may be omitted from the magnetoresistive device 300 and/or the magnetoresistive device 301.

The seed layer 302 facilitates growth of the AFM pinning layer 304 to grow a microstructure with a strong crystalline texture and to provide a strong antiferromagnetic exchange bias. The seed layer 302 includes a multiple layer stack of Ta/NiFeCr/NiFe, Ta/NiFe, Ta/Ru, or Ta/Cu or other suitable seed layers. The AFM pinning layer 304 fixes or pins the magnetization direction of the reference layer 306 by exchange-coupling. The AFM pinning layer 304 includes single or multiple layers of FeMn, NiMn, PtMn, IrMn, PdMn, PtPdMn RhMn, IrMnCr, other AFM materials, and combinations thereof.

The reference layer 306 can include a simple pinned layer acting as the reference layer or one or more synthetic antiferromagnetic (SAF) structures. A simple pinned layer is pinned by the AFM pinning layer 304 and acts as a reference layer to the free layer 330. One example of a SAF structure includes a pinned layer pinned by the AFM pinning layer 304. The pinned layer is antiparallel coupled to a reference layer across an antiparallel (AP) coupling layer. The pinned layer and the AP coupled reference layer includes single or multiple layers of CoFe, CoB, CoFeB, other ferromagnetic materials, and combinations thereof. The AP coupling layer can includes Ru, Ir, Rh, Cr, or alloys thereof.

The barrier layer 320 and the non-ferromagnetic capping layer 340 can be any suitable material. For example, the barrier layer 320 can include an electrically insulating material of MgO, AlOx, TiOx, or other suitable electrically insulating materials. In certain embodiments, the barrier layer 320 is formed to a thickness of about 10 Å or less. In certain embodiments, the barrier layer is MgO due to the promotion of (001) texture from the CoFe ferromagnetic nanolayer 331 and the amorphous boron layer 332.

The non-ferromagnetic capping layer 340 can include a non-magnetic material that separates the free layer 330 from the fixed mixed magnetization of the upper shield S2. Examples of non-magnetic materials include single or multiple layers of a material selected from Ta, Ti, Cr, Ru, Hf, Cu, Ag, and combinations thereof.

Due to a narrow read gap between the shields (S1, S2) to achieve reading of high recording densities, the free layer 330 has a thickness of about 100 Å or less in certain embodiments to form a narrow read gap sensor. A narrow read gap sensor requires a free layer 330 with a high magnetic moment. A free layer of CoFeB has a desirable high magnetic moment and an undesirable high coercivity.

Breaking the thick CoFeB layer into smaller sub-layers separated by the amorphous insertion layer 334 provides a desirable high magnetic moment and a desirable low coercivity.

To facilitate improving the tunnel magnetoresistance and increasing the magnetic moment of the free layer 330, the free layer 330 includes a ferromagnetic nanolayer 331, such as a CoFe50 ferromagnetic nanolayer 331, which can undesirably have a high magnetostriction. However, the one or more layers between the ferromagnetic nanolayer 331 and the boron layer 332 (such as the first layer 342 and the second layer 343 described above) facilitate a read sensor with higher SNR and/or with high reliability. Furthermore, the ferromagnetic insertion layer 342, such as a CoFe10 ferromagnetic insertion layer 342, grown on the ferromagnetic nanolayer 331 may result in a nanocrystalline structure that aids the crystallization of the MgO barrier layer 320.

Figure 4A:
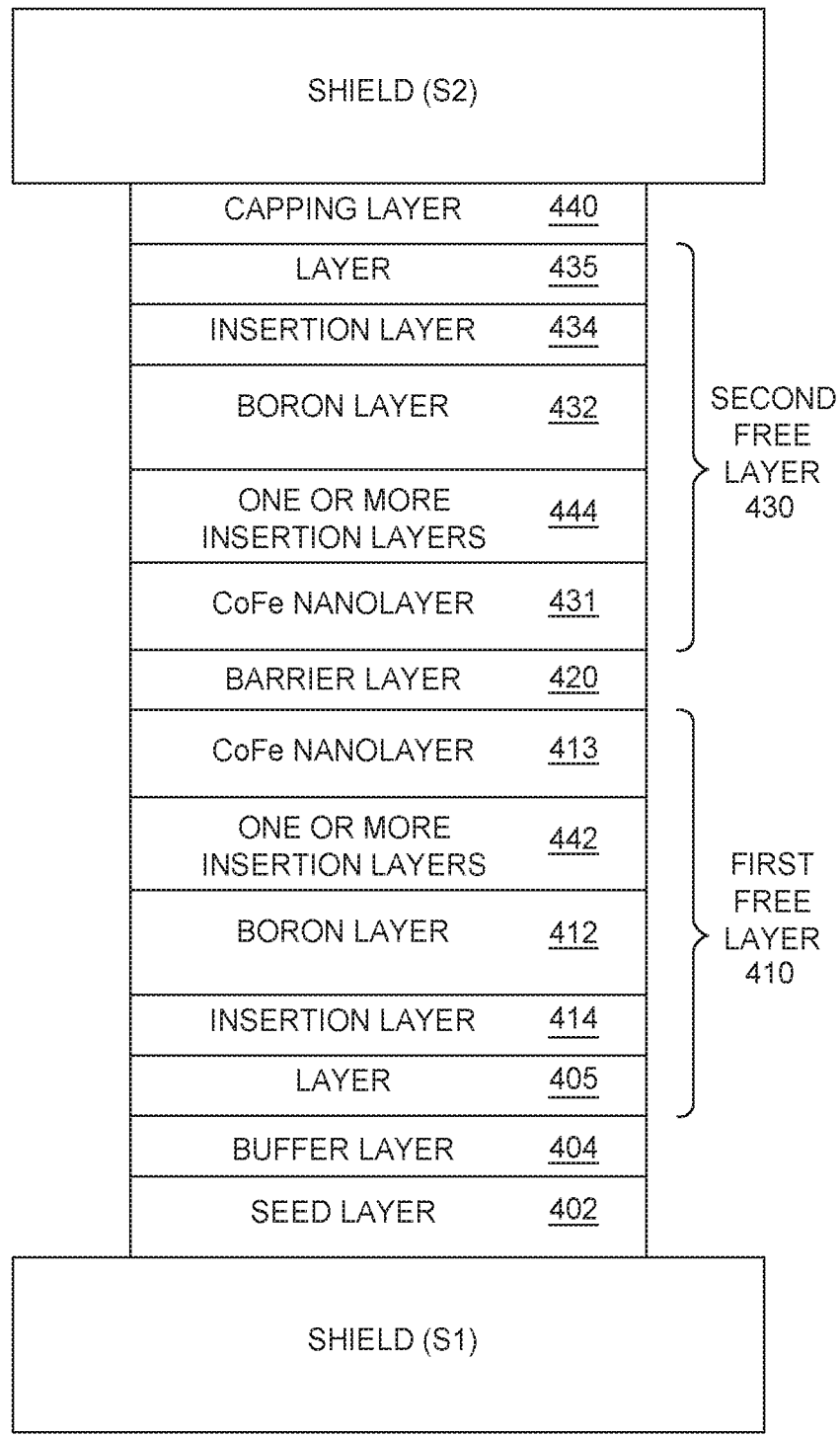
FIG. 4A is a schematic illustration of a media facing surface (MFS) of a magnetoresistive device between the shields of a magnetic read head, such as the magnetic read head of FIG. 2 or other magnetic read heads, that includes one or more layers in each free layer of a dual free layer, according to one implementation.

FIG. 4A is a schematic illustration of a media facing surface (MFS) of a magnetoresistive device 400 between the shields S1 and S2 of a magnetic read head, such as the magnetic read head 211 of FIG. 2 or other magnetic read heads, that includes one or more layers 442, 444 in each free layer of a dual free layer, according to one implementation. The magnetoresistive device 400 includes a first free layer 410, a barrier layer 420 over the first free layer 410, and a second free layer 430 over the barrier layer 420. Furthermore, the magnetoresistive device 300 may include an insertion layer and an amorphous layer.

In certain embodiments, the magnetoresistive device 400 can be fabricated by forming a seed layer 402, over a lower shield S1. A buffer layer 404 is formed over the seed layer 402. The first free layer 410 is formed over the buffer layer 404. The barrier layer 420 is formed over the first free layer 410. The second free layer 430 is formed over the barrier layer 420. A capping layer 440 is formed over the second free layer 430. An upper shield S2 is formed over the capping layer 440.

The first free layer 410 and the second free layer 430 each includes a ferromagnetic nanolayer 413, 431 adjacent the barrier layer 420; and a boron layer 412, 432. In each of the first and second free layers 410, 430, one or more ferromagnetic insertion layers 442, 444 having a nano-crystalline structure are disposed between the respective ferromagnetic nanolayers 413, 431 and the respective boron layers 412, 432 of the first and second free layers 410, 430. The one or more layers 442, 444 are similar to the first layer 342, and/or the second layer 343 described above, and includes one or more of the aspects, features, components, and/or properties thereof.

The first and second free layers 410, 430 may also include an amorphous insertion layer 414 below the boron layer 412 and an amorphous insertion layer 434 above the boron layer 432.

The amorphous insertion layer 434 may be used when the magnetoresistive device 400 includes one or more layers 435 between the capping layer 440 and the boron layer 432. The one or more layers 435 can include one or more amorphous boron layers similar to the boron layer 432, or a layer having negative magnetorestriction, such as an NiFe alloy layer for magnetorestriction control. The amorphous insertion layer 414 may be used when the magnetoresistive device 400 includes one or more layers 405 between the seed layer 402 and the boron layer 412. The one or more layers 405 can include one or more amorphous boron layers similar to the boron layer 412, or a layer having negative magnetorestriction, such as an NiFe alloy layer for magnetorestriction control.

The present disclosure contemplates that one or more layers, such as the amorphous insertion layers 414, 434, the sets of one or more layers 405, 435, and/or the buffer layer 404 may be omitted from the magnetoresistive device 400 and/or the magnetoresistive device 401 described below for FIG. 4B.

The ferromagnetic nanolayers 413, 431 interface with the barrier layer 420 and promote the crystalline texture of the barrier layer 420, such as a barrier layer that includes MgO with (001) crystalline texture. In one embodiment, which can be combined with other embodiments, the ferromagnetic nanolayers 413, 431 each independently has a thickness from about 1 Å to about 10 Å.

The ferromagnetic nanolayers 413, 431 includes CoFe with an atomic percent content of Fe from about 20% to about 80%. In certain embodiments, the ferromagnetic nanolayers 413, 431 (e.g., CoFe ferromagnetic nanolayers 413, 431) includes CoFe with an atomic percent content of Fe from about 50% to about 70% so that a tunneling magnetoresistive (TMR) of the magnetoresistive device is higher than a magnetoresistive device with a CoFe ferromagnetic nanolayers 413, 431 having an atomic percent content of Fe of less than 50%. CoFe ferromagnetic nanolayers 413, 431 have a positive magnetostriction. A higher atomic percent content of Fe of the CoFe ferromagnetic nanolayers 413, 431 increases the positive magnetostriction of the CoFe ferromagnetic nanolayers 413, 431. The CoFe ferromagnetic nanolayers 413, 431 may be referred to herein as CoFe50 ferromagnetic nanolayers 413, 431 to represent a Fe atomic percent of about 50%. The CoFe50 ferromagnetic nanolayers 413, 431 have a body centered cubic (BCC) configuration, where the atoms of the compound are arranged at the corners of the cube with another atom at the cube center.

The boron layers 412, 432 include one or more of CoFeB or CoB. In one embodiment, which can be combined with other embodiments, the boron layers 412, 432 include CoFeB with Fe in an atomic percent content of about 60% or less, such as from 0% to about 60%, and B in an atomic percent content from about 5% to about 50%.

In one embodiment, which can be combined with other embodiments, the boron layers 412, 432 include CoB with B in an atomic percent content of about 5% to about 50%. The boron layers 412, 432 may each include a CoB bilayer (e.g., multiple CoB layers) that has low magnetostriction in comparison to other bilayers that includes Fe or Fe alloys, such as FeB or CoFeB. In certain aspects, the low magnetostriction of the CoB bilayer improves the bias point of the sensor and reduces the noise of the magnetoresistive signal providing a higher signal-to-noise ratio (SNR) in comparison to bilayers with high magnetostriction. In certain aspects, the low magnetostriction of the CoB bilayer increases the reliability of the free layers 410, 430 due to reduced deformation and/or delamination of layers in comparison to bilayers with high magnetostriction. The CoB layers proximate to the barrier layer 420 tends to have more negative magnetostriction. In certain aspects, the large thickness of CoB layers 412, 432 provides a negative magnetostriction to balance out the positive magnetostriction of the CoFe50 ferromagnetic nanolayers 413, 431 so that the overall magnetostriction of the free layers 410, 430 is low or zero to further increase SNR and/or to further increase reliability.

Magnetostriction of the free layers 410, 430 of the magnetoresistive device 400 is due to the magnetic coupling of sub-layers of the free layers 410, 430, the texture of the sub-layers of the free layers 410, 430, and/or the materials of the sub-layers of the free layers 410, 430. In one embodiment, the free layers 410, 430 includes two or more boron layers, such as a multiple of the boron layers 412, 432 described in FIGS. 4A-4B, each separated by an amorphous insertion layer, where each of the boron layers have a different thickness to control the magnetostriction of the free layers 410, 430.

In one example, a ferromagnetic insertion layer 442 of the first free layer 410 includes CoFe or Co deposited on the boron layer 412 that includes CoFeB, and a ferromagnetic insertion layer 444 of the second free layer 430 includes CoFe or Co deposited on the boron layer 412. The ferromagnetic insertion layers 442, 444 include CoFe with Fe in an atomic percent of about 30% or less, such as about 0% to about 30%, or about 10%. The CoFe ferromagnetic insertion layers 442, 444 may be referred to as CoFe10 ferromagnetic insertion layers 442, 444 to represent a Fe atomic percent of about 10%. Furthermore, the CoFe10 ferromagnetic insertion layers 442, 444 have a face centered cubic (FCC) configuration, where the atoms of the compound are arranged at the corners of the cube and at the center of each cube face of the cube. The BCC structure of the CoFe50 ferromagnetic nanolayers 413, 431 and the FCC structure of the CoFe10 ferromagnetic insertion layers 442, 444 combine to form a disordered layer with a nano-crystalline structure.

In one example, the ferromagnetic insertion layers 442, 444 include materials having an FCC structure or a hexagonal close packed (HCP) structure and are grown on or below the respective nanolayers 413, 431 that have a BCC crystalline structure. The layers 442, 444 and 413, 431 combine to form a disordered layer with a nano-crystalline structure.

The amorphous insertion layer 414 of the first free layer 410 is deposited on the buffer layer 404 and the amorphous insertion layer 434 is deposited on the boron layer 432. The amorphous insertion layers 414, 434 each include CoHf with an atomic percent content of Hf from about 5% to about 95%. In some embodiments, the amorphous insertion layers 414, 434 each include ferromagnetic CoHf with an atomic percent content of Hf from about 5% to about 30%. In some embodiments, each of the amorphous insertion layers 414, 434 is selected from a group that includes CoHf, CoFeHf, CoFeTa, CoFeB, CoFeBHf, CoFeBTa, Ta, and Hf. In some embodiments, each of the amorphous insertion layers 414, 434 is formed to a thickness from about 2 Å to about 20 Å, such as from about 2 Å to about 6 Å.

The seed layer 402 and buffer layer 404 facilitate growth of a sensor with a desirable microstructure. The seed layer 402 includes a multiple layer stack of Ta/NiFeCr/NiFe, Ta/NiFe, Ta/Ru, or Ta/Cu or other suitable seed layers.

The barrier layer 420 and the capping layer 440 can be any suitable material. For example, the barrier layer 420 can include an electrically insulating material of MgO, AlOx, TiOx, or other suitable electrically insulating materials. In certain embodiments, the barrier layer 420 is formed to a thickness of about 10 Å or less. In some embodiments, the barrier layer is MgO due to the promotion of (001) texture from the CoFe ferromagnetic nanolayers 413, 431 and the boron layers 412, 432.

The capping layer 440 can include a non-magnetic material that separates the second free layer 430 from the fixed mixed magnetization of the upper shield S2. Examples of non-magnetic materials include single or multiple layers of a material selected from Ta, Ti, Cr, Ru, Hf, Cu, Ag, and combinations thereof.

Due to a narrow read gap between the shields (S1, S2) to achieve reading of high recording densities, each of the free layers 410, 430 has a thickness of about 100 Å or less in some embodiments to form a narrow read gap sensor. The free layers 410, 430 include a high magnetic moment to facilitate a narrow read gap sensor. Free layers of CoFeB have a desirable high magnetic moment and an undesirable high coercivity. The ferromagnetic insertion layers 442, 444 facilitate a high magnetic moment and a low coercivity with the boron layers 412, 432 to facilitate high SNR and high reliability of read sensors, which can be especially so when the boron layers 412, 432 are each divided into smaller sub-layers that may be separated by amorphous insertion layers such as the amorphous insertion layers 414, 434. Furthermore, the ferromagnetic insertion layers 442, 444, such as the CoFe10 ferromagnetic insertion layers 442, 444, grown in the respective locations of the first free layer 410 and the second free layer 430 may result in a nanocrystalline structure that aids the crystallization of the MgO barrier layer 420. Breaking each of the thick CoFeB layers into smaller sub-layers separated by the respective amorphous insertion layers 414, 434 provides a desirable high magnetic moment and a desirable low coercivity.

Figure 4B:
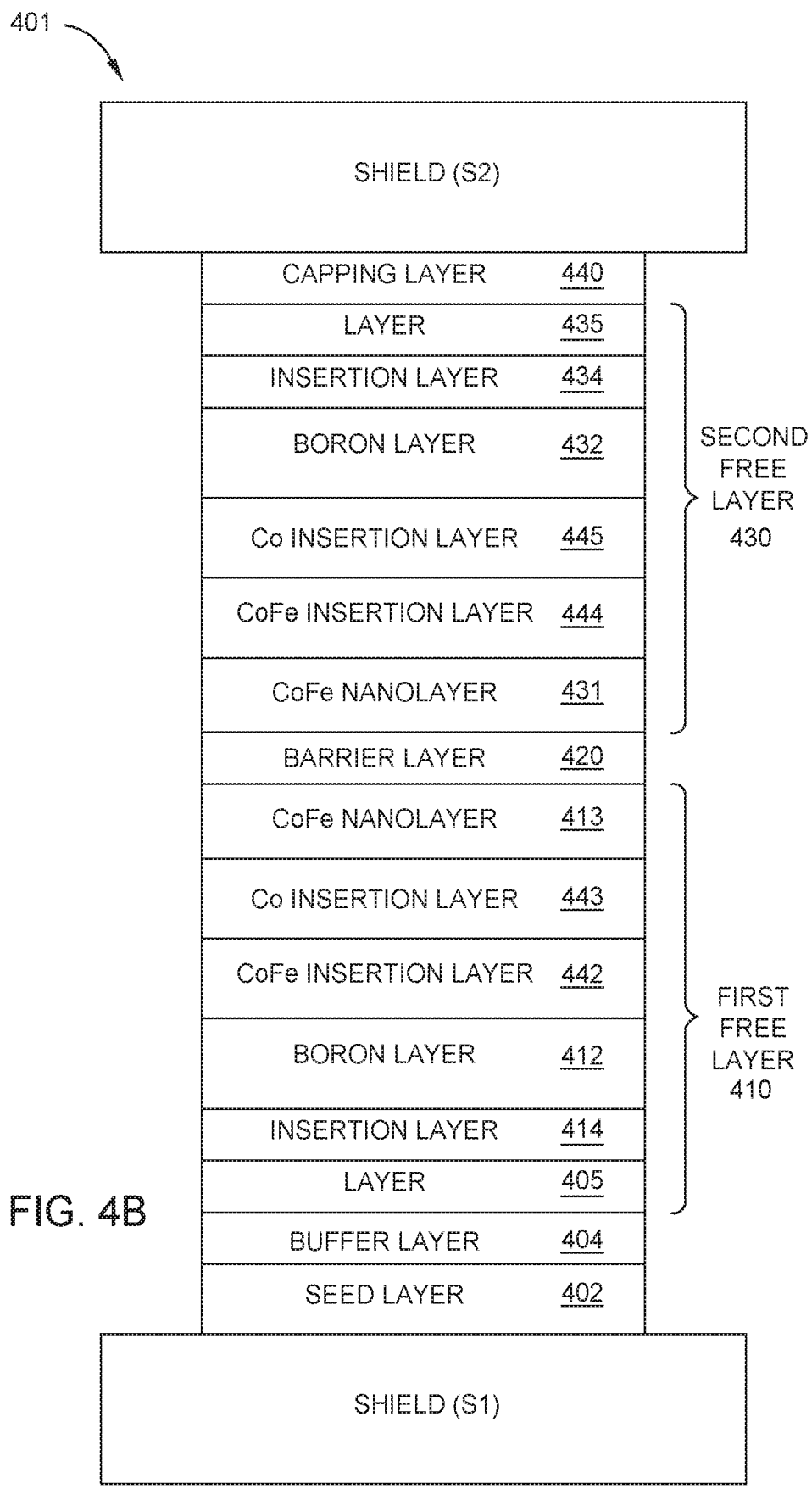
FIG. 4B is a schematic illustration of a media facing surface (MFS) of a magnetoresistive device between the shields of a magnetic read head, such as the magnetic read head of FIG. 2 or other magnetic read heads, that includes one or more layers in each free layer of a dual free layer, according to one implementation.

FIG. 4B is a schematic illustration of a media facing surface (MFS) of a magnetoresistive device 401 between the shields S1 and S2 of a magnetic read head, such as the magnetic read head 211 of FIG. 2 or other magnetic read heads, that includes one or more layers 442-443, 444-445 in each free layer of a dual free layer, according to one implementation. The magnetoresistive device 401 shown in FIG. 4B is similar to the magnetoresistive device 400 shown in FIG. 4A, and includes one or more of the aspects, features, components, and/or properties thereof.

The one or more layers between the boron layer 412 and the ferromagnetic nanolayer 413 of the first free layer 410 include a first layer 442 (as described for FIG. 4A) and a second layer 443 formed on the first layer 442 and between the first layer 442 and the ferromagnetic nanolayer 413. The one or more layers between the boron layer 432 and the ferromagnetic nanolayer 431 of the second free layer 430 include a first layer 444 (as described for FIG. 4A) and a second layer 445 formed on the first layer 445 and between the first layer 445 and the ferromagnetic nanolayer 431.

Each of the first layers 442, 444 or the second layers 443, 445 can include Co, CoFe, or a combination thereof. In the implementation shown, the first layers 442, 444 include CoFe and the second layers 443, 445 include Co. The present disclosure contemplates that the positions of the first and second layers 442, 443 of the first free layer 410 may be reversed such that the second layer 443 is deposited on the first layer 442. The present disclosure contemplates that the positions of the first and second layers 444, 445 of the second free layer 430 may be reversed such that the second layer 445 is deposited on the first layer 444.

Figure 5:
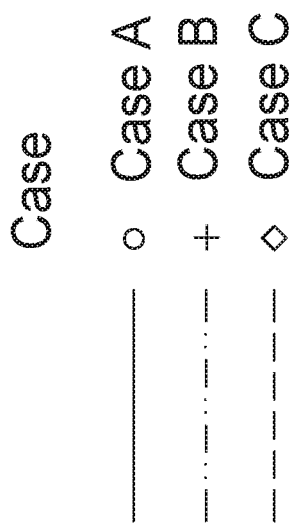
FIG. 5 is a graph illustrating increased TMR for magnetic tunnel junctions, using aspects of the present disclosure, according to one implementation.
Figure 5:
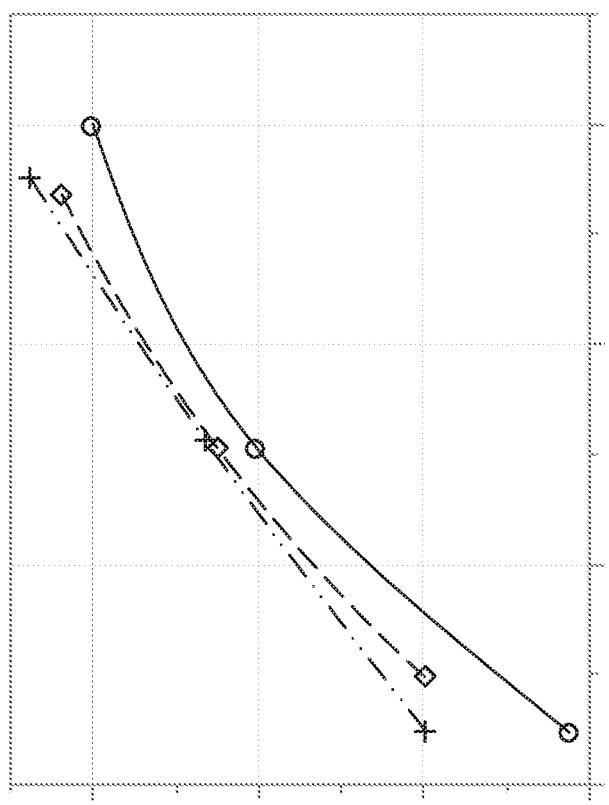

FIG. 5 is a graph illustrating increased TMR for magnetic tunnel junctions, using aspects of the present disclosure, according to one implementation. The normalized tunnel magnetoresistance (TMR) is graphed on the y-axis and the normalized resistance area (RA) is graphed on the x-axis. Case A, the base case, includes a free layer that includes a CoFe50 ferromagnetic nanolayer and a CoFeB boron layer, where the thickness of the boron layer is "x". The variable "x" refers to an appropriate first thickness of a CoFeB layer or a CoB layer within a free layer of a magnetoresistive device. Case B includes a CoFe10 ferromagnetic insertion layer between a CoFe50 ferromagnetic nanolayer and the CoFeB boron layer, where the boron layer has a thickness of "x-y" and the CoFe10 ferromagnetic insertion layer has a thickness of "y". The variable "y" refers to a second thickness that is greater than 0, but less than "x". For example, the ratio of the thickness of the boron layer to the CoFe10 ferromagnetic insertion layer may be 0.5, where the CoFe10 ferromagnetic insertion layer is twice as thick as the boron layer. Case C includes a CoFe10 ferromagnetic insertion layer between a CoFe50 ferromagnetic nanolayer and a CoFeB boron layer, where the boron layer has a thickness of "x-z" and the CoFe10 ferromagnetic insertion layer has a thickness of "z". The variable "z" refers to a second thickness that is greater than 0, but less than "x" and less than "y". For example, the ratio of the thickness of the boron layer to the CoFe10 ferromagnetic insertion layer may be 2.0, where the CoFe10 ferromagnetic insertion layer is half as thick as the boron layer. In one embodiment, the CoFe10 ferromagnetic insertion layer may have a thickness of "y", the thickness of the boron layer "x" plus the thickness of the CoFe10 ferromagnetic insertion layer "y" is greater than the thickness of the original boron layer, such as in Case A.

By including the CoFe10 ferromagnetic insertion layer, the normalized TMR of Case B and Case C is increased across values of normalized resistance area (RA) when compared to the normalized TMR of Case A for each corresponding value of normalized resistance area. At lower normalized resistance areas (RA's), the increase of normalized TMR for the Case B and the Case C may result in better crystallization of the MgO barrier due to better TMR.

Figure 6:
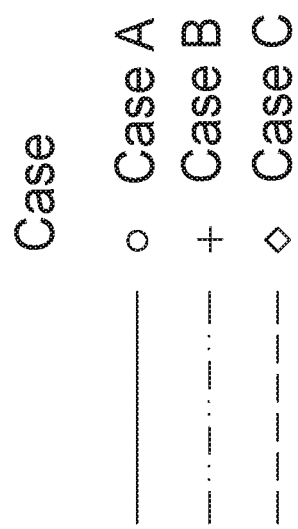
FIG. 6 is a graph illustrating reduced interlayer coupling magnetic field (Hint) for magnetic tunnel junctions, according to one implementation.
Figure 6:
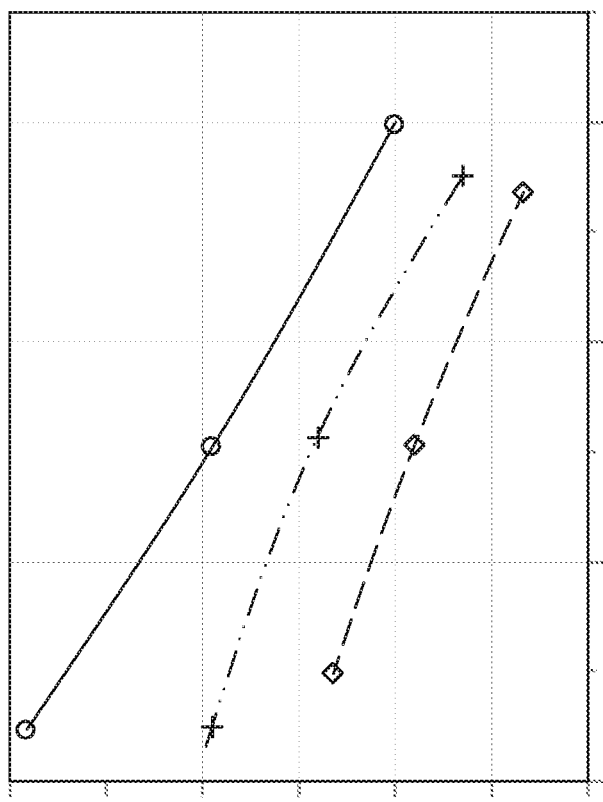

FIG. 6 is a graph illustrating reduced interlayer coupling magnetic field (Hint) for magnetic tunnel junctions, according to one implementation. The normalized interlayer coupling magnetic field (Hint) is graphed on the y-axis and the normalized resistance area (RA) is graphed on the x-axis. Case A includes a free layer that includes a CoFe50 ferromagnetic nanolayer and a CoFeB boron layer, where the thickness of the boron layer is "x". The variable "x" refers to an appropriate first thickness of a boron layer within a free layer of a magnetoresistive device. Case B includes a CoFe10 ferromagnetic insertion layer between a CoFe50 ferromagnetic nanolayer and a CoFeB boron layer, where the boron layer has a thickness of "x-y" and the CoFe10 ferromagnetic insertion layer has a thickness of "y". The variable "y" refers to a second thickness that is greater than 0, but less than "x". For example, the ratio of the thickness of the boron layer to the CoFe10 ferromagnetic insertion layer may be 0.5, where the CoFe10 ferromagnetic insertion layer is twice as thick as the boron layer. Case C includes a CoFe10 ferromagnetic insertion layer between a CoFe50 ferromagnetic nanolayer and a CoFeB boron layer, where the boron layer has a thickness of "x-z" and the CoFe10 ferromagnetic insertion layer has a thickness of "z". The variable "z" refers to a second thickness that is greater than 0, but less than "x" and less than "y". For example, the ratio of the thickness of the boron layer to the CoFe10 ferromagnetic insertion layer may be 2.0, where the CoFe10 ferromagnetic insertion layer is half as thick as the boron layer. In one embodiment, the CoFe10 ferromagnetic insertion layer may have a thickness of "y", and the thickness of the boron layer "x" plus the thickness of the CoFe10 ferromagnetic insertion layer "y" is greater than the thickness of the original boron layer, such as in Case A.

By including the CoFe10 ferromagnetic insertion layer, the normalized Hint of Case B and Case C is decreased for each value of normalized resistance area (RA) when compared to the normalized Hint of Case A for each corresponding value of normalized resistance area. At lower normalized resistance areas (RA's), the greater decrease of the normalized Hint for the Case B and the Case C may result in better crystallization of the MgO barrier due to less interlayer coupling.

Benefits of the present disclosure include increased TMR and decreased interlayer coupling (Hint) across resistance area values of magnetoresistive devices, such as decreased resistance area values for next generation read heads. Including one or more ferromagnetic insertion layers, such as a CoFe10 ferromagnetic insertion layer, between the boron layer (such as the CoFeB layer or the CoB layer) and the ferromagnetic nanolayer (such as the CoFe50 ferromagnetic nanolayer) facilitates increased TMR and reduced interlayer coupling, including for lower values of resistance areas. The increased TMR, reduced interlayer coupling, and reduced resistance areas facilitate effective sensor recording.

It is contemplated that one or more aspects disclosed herein may be combined. Moreover, it is contemplated that one or more aspects disclosed herein may include some or all of the aforementioned benefits.

In one embodiment, a magnetoresistive device comprises a barrier layer, a free layer above the barrier layer, and a non-ferromagnetic capping layer above the free layer. The free layer includes a ferromagnetic nanolayer on the barrier layer, a boron layer above the ferromagnetic nanolayer, where the boron layer includes one or more of CoFeB or CoB, and one or more layers between the ferromagnetic nanolayer and the boron layer, where the one or more layers include one or more of Co or CoFe. The one or more layers between the ferromagnetic layer and the boron layer include CoFe with Fe having an atomic percent content of 30% or less. The atomic percent content of Fe of the one or more layers is about 10%. The ferromagnetic nanolayer includes CoFe. The ferromagnetic nanolayer includes CoFe with Fe having an atomic percent content of about 50%. The free layer further includes an insertion layer above the boron layer, and one or more boron layers or a layer having negative magnetorestriction disposed between the insertion layer and the non-ferromagnetic capping layer. The one or more layers between the ferromagnetic nanolayer and the boron layer includes a first layer that includes CoFe and a second layer that includes Co. The boron layer is amorphous. The barrier layer includes MgO. A magnetic recording head that includes the magnetoresistive device is also disclosed. A data storage device that includes the magnetic recording head is also disclosed. A magnetic resistive random memory (MRAM) device that includes the magnetoresistive device is also disclosed. A spintronic device that includes the magnetoresistive device is also disclosed.

In another embodiment, a magnetoresistive device comprises a seed layer, a barrier layer above the seed layer, a free layer above the barrier layer, and a non-ferromagnetic capping layer above the free layer. The free layer includes a ferromagnetic nanolayer on the barrier layer, where the ferromagnetic nanolayer includes a crystalline structure that is BCC. The free layer includes an amorphous layer above the ferromagnetic nanolayer, and one or more layers between the ferromagnetic nanolayer and the amorphous layer, where the one or more layers includes a crystalline structure that is FCC. The crystalline structure of the one or more layers between the ferromagnetic nanolayer and the amorphous layer is grown as FCC or HCP on the ferromagnetic nanolayer from a material that includes a crystalline structure that is BCC. The one or more layers between the ferromagnetic nanolayer and the amorphous layer includes one or more of Co or CoFe. The amorphous layer includes one or more of CoFeB or CoB, and the ferromagnetic nanolayer includes CoFe. A magnetic recording head that includes the magnetoresistive device is also disclosed. A data storage device that includes the magnetic recording head is also disclosed. A magnetic resistive random memory (MRAM) device that includes the magnetoresistive device is also disclosed. A spintronic device that includes the magnetoresistive device is also disclosed.

In one example of such an embodiments, the magnetoresistive device also includes an anti-ferromagnetic exchange pinning layer (AFM), a ferromagnetic pinned layer or a pinned layer anti-ferromagnetically coupled to a ferromagnetic reference layer through a non-magnetic spacer that includes a material such as Ru. The barrier layer is above the reference layer. The free layer also includes an insertion layer above the amorphous layer. The insertion layer includes an amorphous ferromagnetic layer and a second ferromagnetic layer used to tune the properties such as magnetostriction of the free layer.

In another embodiment, a magnetoresistive device comprises a seed layer, a barrier layer above the seed layer, a free layer above the barrier layer, and a non-ferromagnetic capping layer above the free layer. The free layer includes a ferromagnetic nanolayer on the barrier layer, and a boron layer above the ferromagnetic nanolayer. The boron layer includes one or more of CoFeB or CoB, and the boron layer includes a thickness of 15 Angstroms or less. The free layer includes one or more layers between the ferromagnetic nanolayer and the boron layer, where the one or more layers each include a thickness of 10 Angstroms or less. The thickness of the one or more layers between the ferromagnetic nanolayer and the boron layer is a ratio relative to the thickness of the boron layer, and the ratio is at least 0.25. The ferromagnetic nanolayer includes a thickness of less than 10 Angstroms. The one or more layers between the ferromagnetic nanolayer and the boron layer includes one or more of Co or CoFe. A magnetic recording head that includes the magnetoresistive device is also disclosed. A data storage device that includes the magnetic recording head is also disclosed. A magnetic resistive random memory (MRAM) device that includes the magnetoresistive device is also disclosed. A spintronic device that includes the magnetoresistive device is also disclosed.

In one example of such an embodiments, the magnetoresistive device also includes an anti-ferromagnetic exchange pinning layer (AFM), a ferromagnetic pinned layer or a pinned layer anti-ferromagnetically coupled to a ferromagnetic reference layer through a non-magnetic spacer that includes a material such as Ru. The barrier layer is above the reference layer. The free layer also includes an insertion layer above the amorphous layer. The insertion layer includes an amorphous ferromagnetic layer and a second ferromagnetic layer used to tune the properties such as magnetostriction of the free layer.

In one embodiment, a magnetoresistive device comprises a seed layer, a first free layer above the seed layer, a barrier layer above the first free layer, a second free layer above the barrier layer, and a non-ferromagnetic capping layer above the second free layer. The first free layer includes a ferromagnetic nanolayer, a boron layer, where the boron layer includes one or more of CoFeB or CoB, and one or more layers between the ferromagnetic nanolayer and the boron layer, where the one or more layers include one or more of Co or CoFe. The second free layer includes a ferromagnetic nanolayer, a boron layer, where the boron layer includes one or more of CoFeB or CoB, and one or more layers between the ferromagnetic nanolayer and the boron layer, where the one or more layers include one or more of Co or CoFe.

In another embodiment, a magnetoresistive device comprises a seed layer, a first free layer above the seed layer, a barrier layer above the first free layer, a second free layer above the barrier layer, and a non-ferromagnetic capping layer above the second free layer. The first free layer includes a ferromagnetic nanolayer that includes a crystalline structure that is BCC. The first free layer includes an amorphous layer, and one or more layers between the ferromagnetic nanolayer and the amorphous layer, where the one or more layers includes a crystalline structure that is FCC. The second free layer includes a ferromagnetic nanolayer that includes a crystalline structure that is BCC. The second free layer includes an amorphous layer, and one or more layers between the ferromagnetic nanolayer and the amorphous layer, where the one or more layers includes a crystalline structure that is FCC.

In another embodiment, a magnetoresistive device comprises a seed layer, a first free layer above the seed layer, a barrier layer above the first free layer, a second free layer above the barrier layer, and a non-ferromagnetic capping layer above the second free layer. The first free layer includes a ferromagnetic nanolayer and a boron layer. The boron layer includes one or more of CoFeB or CoB, and the boron layer includes a thickness of 15 Angstroms or less. The first free layer includes one or more layers between the ferromagnetic nanolayer and the boron layer, where the one or more layers each include a thickness of 10 Angstroms or less. The second free layer includes a ferromagnetic nanolayer and a boron layer. The boron layer includes one or more of CoFeB or CoB, and the boron layer includes a thickness of 15 Angstroms or less. The second free layer includes one or more layers between the ferromagnetic nanolayer and the boron layer, where the one or more layers each include a thickness of 10 Angstroms or less.

While the foregoing is directed to embodiments of the present disclosure, other and further embodiments of the disclosure may be devised without departing from the basic scope thereof, and the scope thereof is determined by the claims that follow.

What is claimed is:
1. A magnetic sensor, comprising:
a barrier layer;
a free layer above the barrier layer, the free layer comprising:
a ferromagnetic nanolayer on the barrier layer,
a boron layer above the ferromagnetic nanolayer, the boron layer comprising one or more of CoFeB or CoB, and
one or more layers between the ferromagnetic nanolayer and the boron layer, the one or more layers comprising one or more of Co or CoFe, wherein the one or more layers between the ferromagnetic nanolayer and the boron layer comprise:
a first layer comprising CoFe; and
a second layer comprising Co; and
a non-ferromagnetic capping layer above the free layer.
2. The magnetic sensor of claim 1, wherein the first layer of the one or more layers between the ferromagnetic nanolayer and the boron layer comprises CoFe with Fe having an atomic percent content of 30% or less.
3. The magnetic sensor of claim 2, wherein the atomic percent content of Fe of the one or more layers is about 10%.
4. The magnetic sensor of claim 1, wherein the ferromagnetic nanolayer comprises CoFe.
5. The magnetic sensor of claim 4, wherein the ferromagnetic nanolayer comprises CoFe with Fe having an atomic percent content of about 50%.
6. The magnetic sensor of claim 1, wherein the free layer further comprises an insertion layer above the boron layer, and one or more boron layers or a layer having negative magnetorestriction disposed between the insertion layer and the non-ferromagnetic capping layer.

7. The magnetic sensor of claim 1, wherein the boron layer is amorphous.

8. The magnetic sensor of claim 1, wherein the barrier layer comprises MgO.

9. A magnetic recording head comprising the magnetic sensor of claim 1.

10. A data storage device comprising the magnetic recording head of claim 9.

11. A magnetic resistive random memory (MRAM) device comprising the magnetic sensor of claim 1.

12. A spintronic device comprising the magnetic sensor of claim 1.

13. The magnetic sensor of claim 1, further comprising a ferromagnetic reference layer, wherein the barrier layer is disposed on and in contact with the ferromagnetic reference layer.

14. A magnetic sensor, comprising:
a seed layer;
a barrier layer above the seed layer;
a free layer above the barrier layer, the free layer comprising:
a ferromagnetic nanolayer on the barrier layer, the ferromagnetic nanolayer comprising a crystalline structure that is BCC;
an amorphous layer above the ferromagnetic nanolayer,
one or more layers between the ferromagnetic nanolayer and the amorphous layer, the one or more layers comprising a crystalline structure that is FCC, wherein the one or more layers between the ferromagnetic nanolayer and the amorphous layer comprise:
a first layer comprising CoFe; and
a second layer comprising Co; and
a non-ferromagnetic capping layer above the free layer.

15. The magnetic sensor of claim 14, wherein the crystalline structure of the one or more layers between the ferromagnetic nanolayer and the amorphous layer is grown as FCC or HCP on the ferromagnetic nanolayer from a material having a crystalline structure that is BCC.

16. The magnetic sensor of claim 14, wherein the amorphous layer comprises one or more of CoFeB or CoB, and the ferromagnetic nanolayer comprises CoFe.

17. A magnetic recording head comprising the magnetic sensor of claim 14.

18. A data storage device comprising the magnetic recording head of claim 17.

19. A magnetic resistive random memory (MRAM) device comprising the magnetic sensor of claim 14.

20. A spintronic device comprising the magnetic sensor of claim 14.

21. The magnetic sensor of claim 14, wherein the first layer of the one or more layers between the ferromagnetic nanolayer and the amorphous layer comprises CoFe with Fe having an atomic percent content of about 10%.

22. A magnetic sensor, comprising:
a seed layer;
a barrier layer above the seed layer;
a free layer above the barrier layer, the free layer comprising:
a ferromagnetic nanolayer on the barrier layer;
a boron layer above the ferromagnetic nanolayer, the boron layer comprising one or more of CoFeB or CoB, and the boron layer comprising a thickness of 15 Angstroms or less,
one or more layers between the ferromagnetic nanolayer and the boron layer, the one or more layers each comprising a thickness of 10 Angstroms or less, wherein the one or more layers between the ferromagnetic nanolayer and the boron layer comprise:
a first layer comprising CoFe; and
a second layer comprising Co; and
a non-ferromagnetic capping layer above the free layer.

23. The magnetic sensor of claim 22, wherein the thickness of the one or more layers between the ferromagnetic nanolayer and the boron layer is a ratio relative to the thickness of the boron layer, and the ratio is at least 0.25.

24. The magnetic sensor of claim 22, wherein the ferromagnetic nanolayer comprises a thickness of less than 10 Angstroms.

25. A magnetic recording head comprising the magnetic sensor of claim 22.

26. A data storage device comprising the magnetic recording head of claim 25.

27. A magnetic resistive random memory (MRAM) device comprising the magnetic sensor of claim 22.

28. A spintronic device comprising the magnetic sensor of claim 22.

29. The magnetic sensor of claim 22, wherein the free layer further comprises an insertion layer above the boron layer, and one or more boron layers or a layer having negative magnetorestriction disposed between the insertion layer and the non-ferromagnetic capping layer.

* * * * *